(12) United States Patent
Kishimoto

(10) Patent No.: US 6,352,927 B2
(45) Date of Patent: *Mar. 5, 2002

(54) SEMICONDUCTOR WAFER AND METHOD FOR FABRICATION THEREOF

(75) Inventor: Jun Kishimoto, Fukushima-ken (JP)

(73) Assignee: Shin-Etsu Handotai Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/447,309

(22) Filed: Nov. 22, 1999

(30) Foreign Application Priority Data

Nov. 26, 1998 (JP) .......................... 10-335642

(51) Int. Cl.[7] ............................. H01L 21/302
(52) U.S. Cl. .................. 438/690; 438/691; 438/692
(58) Field of Search ................. 438/691, 692, 438/690, 693, 694

(56) References Cited

U.S. PATENT DOCUMENTS

| | | | |
|---|---|---|---|
| 4,144,099 A | | 3/1979 | Edmonds et al. ............ 148/1.5 |
| 4,588,473 A | | 5/1986 | Hisatomi et al. ........... 156/645 |
| 5,227,339 A | * | 7/1993 | Kishii ........................ 437/225 |
| 5,429,711 A | * | 7/1995 | Watanabe et al. ............. 216/52 |
| 5,618,227 A | * | 4/1997 | Tsutsumi et al. ........... 451/288 |
| 5,821,166 A | * | 10/1998 | Hajime et al. .............. 438/691 |

FOREIGN PATENT DOCUMENTS

EP   0 782 179 A2   7/1997   ......... H01L/21/304

OTHER PUBLICATIONS

Search Report dated Apr. 18, 2001 from the European Patent Office concerning Application No. EP 99 12 2057.

* cited by examiner

Primary Examiner—Felisa Hiteshew
Assistant Examiner—Kin-Chan Chen
(74) Attorney, Agent, or Firm—Hogan & Hartson, L.L.P.

(57) ABSTRACT

There is disclosed a semiconductor wafer obtained, at least, by removing a mechanical damage layer by etching both surfaces of the wafer, flattening one of the surfaces by a surface-grinding means, polishing both of the surfaces, and then subjecting a front surface of the wafer to a finishing mirror-polishing when defining the surface subjected to surface-grinding as a back surface of the wafer, and a method for fabricating it. There can be provided a method for fabricating a semiconductor wafer wherein grinding striations which remain on a semiconductor wafer even when double side polishing and finishing mirror-polishing are conducted after a conventional step of surface-grinding of the front surface or the both surfaces, are eliminated to improve quality of the front surface of the wafer, and the back surface having a quality suitable for the device process can be obtained, and a semiconductor wafer obtained thereby.

4 Claims, 3 Drawing Sheets

SEMICONDUCTOR WAFER AND METHOD FOR FABRICATION THEREOF

BACKGROUND OF THE INVENTION

1. Field of the Invention

The present invention relates to a semiconductor wafer, and especially a method for fabrication of a single crystal silicon wafer.

2. Description of the Related Art

Generally, a conventional method for fabricating a semiconductor wafer comprises a slicing step to obtain wafers of a thin disc shape by slicing a single crystal silicon ingot pulled with a single crystal pulling apparatus; a coarse chamfering step to chamfer a peripheral edge portion of the sliced wafer in order to prevent cracking or breakage of the wafer; a lapping step to flatten both of the front surface and the back surface of the chamfered wafer; a cleaning or etching step to remove a remaining mechanical damage layer formed by the chamfering step and lapping step; and a mirror-polishing step to mirror-polish the front surface of the etched wafer. As shown in FIG. 1 [B], adding to these steps, there can be conducted by combination of a step of surface-grinding the front surface or the both surfaces of the wafer, a double side polishing step for polishing both surfaces of the surface-ground wafer, a finishing chamfering step to mirror-polish a peripheral edge portion of the wafer before and after the double side polishing step, the finishing polishing step to mirror-polish the wafer subjected to the double side polishing, and a cleaning step for removing a polishing agent remaining on the polished wafer and contaminant in order to improve cleanness.

In the above-mentioned method for fabrication, the surface-grinding step has been introduced to support the lapping process, since high flatness of the wafer cannot be achieved only by the lapping process when a diameter of the wafer is large, especially more than 300 mm.

However, in the surface-ground wafer, grinding striations (streaks) remain as observed with a magic mirror, even after it is polished in a considerable amount. Furthermore, if it is polished in a considerable amount, the wafer may lose its proper shape, and flatness thereof is degraded.

For example, grinding striations formed at the most peripheral portion during surface-grinding of the front surface or the both surfaces of the wafer have a P-V value of about 0.2 to 0.1 $\mu$m and a striation interval of about 1 to 10 mm. Accordingly, the shape of the polishing cloth is copied (followed) to the shape of the grinding striations when it -is subjected to double side polishing, so that grinding striations remain as micro roughness having a P-V value of about 30 to 50 nm, even after a finishing mirror-polishing step.

In the case of the wafer having high flatness wherein both surfaces are subjected to mirror-polishing, flatness on the back surface is too good, which may easily cause problems in a device process, such as indistinguishability of the front surface from the back surface, necessity of re-adjustment of sensing sensitivity, difficulty of chucking and releasing the wafer, and liabilities in a conveying line such as contamination.

SUMMARY OF THE INVENTION

The present invention has been accomplished to solve the above-mentioned conventional problems, and an object of the invention is to eliminate the grinding striations which remain on the front surface even when double side polishing and front surface finishing mirror-polishing are conducted after the above-mentioned conventional step of surface-grinding of the front surface or the both surfaces, to improve the quality of the front surface of the wafer, and to provide the semiconductor wafer having a proper quality in the back surface suitable for the device process, and a method for fabricating it.

To achieve the above-mentioned object, the present invention provides a semiconductor wafer obtained, at least, by removing a mechanical damage layer by etching both surfaces of the wafer, flattening one of the surfaces by a surface-grinding means, polishing both of the surfaces, and then subjecting a front surface of the wafer to a finishing mirror-polishing when defining the surface subjected to surface-grinding as a back surface of the wafer.

The wafer is excellent in flatness on both surfaces, and condition of the surfaces is different from each other. For example, the front surface is finished to be a mirror surface having no micro roughness formed during surface-grinding, and the back surface is finished to be a surface on which micro roughness (P-V value=about 30 to 50 nm, interval=about 1 to 10 mm) remains as grinding striations.

When the wafer of the present invention is used, there are no grinding striations remaining on the front surface which are formed in the case of the conventional wafer fabricated by conducting lapping of the both surfaces, surface-grinding of the front surface or the both surfaces, double side polishing, and mirror-polishing. Furthermore, when the wafer of the present invention is chucked at the back surface thereof, there are no problems, which may be easily caused in a device process because of too good flatness of the back surface, such as indistinguishability of the front surface from the back surface, necessity of re-adjustment of sensing sensitivity, difficulty of chucking and releasing the wafer, and liabilities in a conveying line such as contamination. Furthermore, the grinding striations on the back surface are never transferred on the front surface in fabrication of the wafer of the present invention. Accordingly, it can be used in a process of highly integrated devices, productivity and yield of a device can be improved, and cost can be significantly reduced.

The present invention also provides a method for fabricating a semiconductor wafer comprising at least slicing a wafer from a semiconductor ingot, lapping both surfaces of the wafer, removing a mechanical damage layer by etching treatment, flattening one of the surfaces by a surface-grinding means, polishing both of the surfaces, and then subjecting a front surface of the wafer to a finishing mirror-polishing when defining the surface subjected to surface-grinding as a back surface of the wafer.

According to the above-mentioned method comprising the double side lapping step, the single side surface-grinding step, the double side polishing step and the step of subjecting the other surface than the above ground surface to a finishing mirror-polishing, a wafer having high flatness can be easily fabricated at low cost, as compared with the conventional method comprising a double side lapping step, a step of grinding a front surface or both surfaces, a double side polishing step and a mirror-polishing step. Furthermore, a problem of grinding striations remaining on the surface, which is one of disadvantages in the conventional method, can be solved, and a wafer having a front surface comprising a mirror surface without grinding striations and micro roughness and a back surface with desired grinding striations, can be fabricated easily and at low cost.

In this case, it is preferable to conduct mirror edge polishing before or after polishing both of the surfaces described above.

When the mirror edge polishing (mirror-polishing on chamfered edge) is conducted before or after the double side polishing step, defects such as cracking or breakage of the wafer can be prevented during polishing or in a device process. The mirror edge polishing is more effective, since it is conducted after the peripheral edge portion of the wafer is ground for coarse chamfering before the lapping step in order to prevent cracking or breakage of the wafer or the like during lapping and a surface-grinding.

It is preferable to etch the wafer by a wet etching method using an alkali solution as a etching solution.

Thereby, it is possible to remove a mechanical damage layer of the wafer, maintaining flatness achieved by the double side lapping step, and to conduct a polishing step effectively with maintaining high flatness, in cooperation with the following single side grinding. A stock removal of the wafer in the etching treatment can be minimal for removing the mechanical damage layer.

As described above, according to the present invention, a semiconductor wafer having the front surface which is a mirror surface with high flatness and high brightness and without micro roughness and the back surface having appropriate fine grinding striations can be fabricated easily and at low cost. Accordingly, when the wafer is chucked in a device process, the grinding striations on the back surface are never transferred on the front surface of the wafer of the present invention, and it can be used in a process of highly integrated devices, productivity and yield of a device can be improved in a device process, and cost can be significantly reduced.

BRIEF DESCRIPTION OF THE DRAWINGS

FIG. 1 (B) is a flow chart showing a conventional method of fabricating a semiconductor wafer from a semiconductor ingot, and a surface condition of the wafer.

DESCRIPTION OF THE INVENTION AND EMBODIMENT

The present invention will now be described in detail, but the present invention is not limited thereto.

The inventors of the present invention have found that it is preferable to use a surface formed by lapping without grinding striations as a front surface, and to use the other surface with grinding striations easily remaining after surface-grinding as a back surface of the wafer, in order to fabricate a wafer wherein grinding striations are eliminated which remain on the front surface even when double side polishing and finishing mirror-polishing are conducted, after a conventional lapping step and a step of surface-grinding a front surface or both surfaces of the wafer described above, and wherein there is no damage or problem relating to the back surface condition formed in a device process, and thereby both quality of the front surface and condition of the back surface can be improved, and have completed the present invention by defining combination of each step such as a lapping step, a surface-grinding step, a polishing step and a mirror-polishing step, and various conditions thereof.

Figure 1:
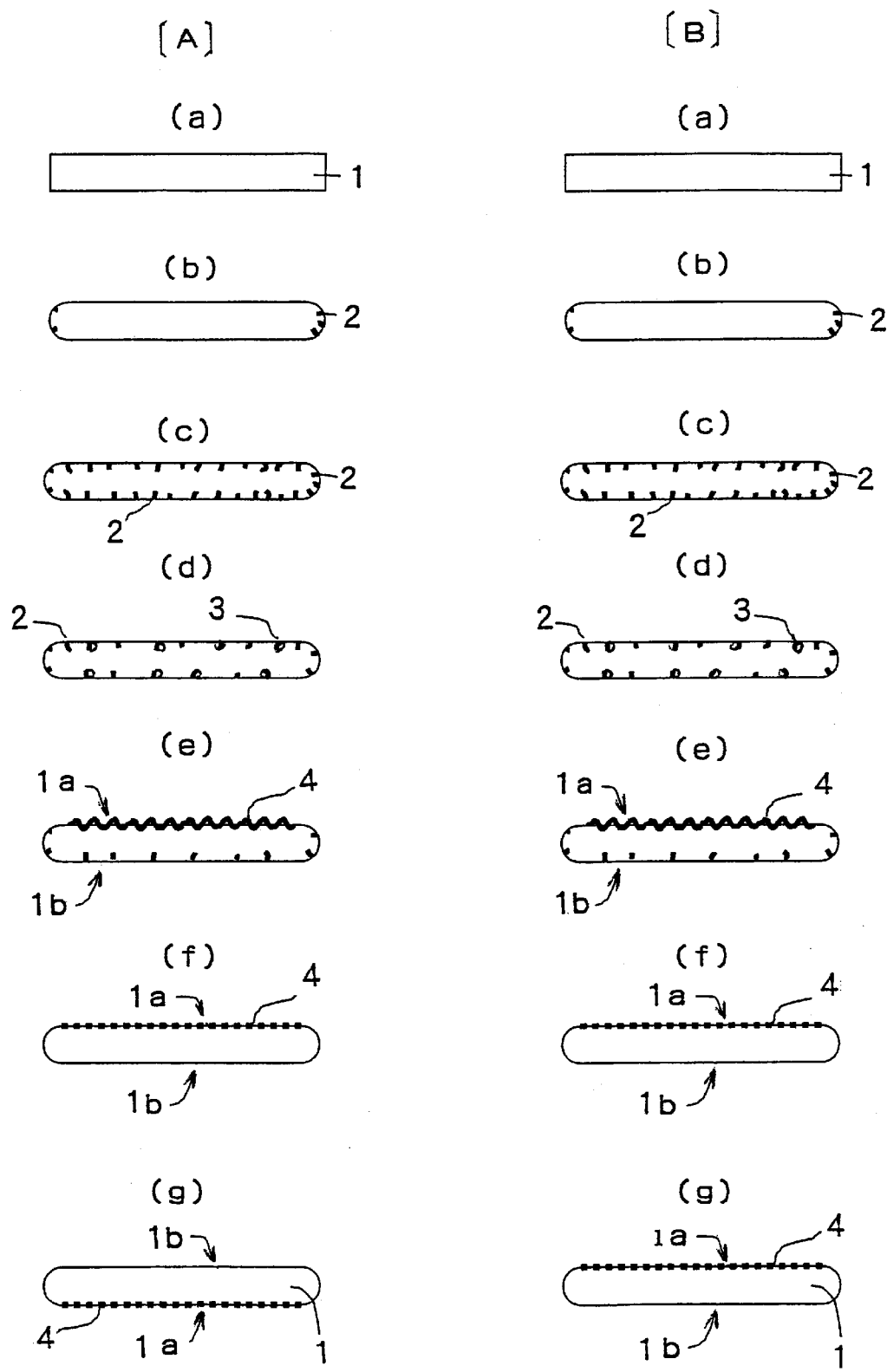
FIG. 1 (A) is a flow chart showing a method of fabricating a semiconductor wafer from a semiconductor ingot according to the present invention, and a surface condition of the wafer.

An-example of a method for fabricating a semiconductor wafer from a semiconductor ingot will be explained below with reference to drawings. FIG. 1 (A) is a flow chart schematically showing a method of fabrication according to the present invention, and a surface condition of the wafer obtained in each step.

The method of fabrication shown in FIG. 1 (A) substantially comprises the following eight steps.

(1) A slicing step of slicing a semiconductor single crystal ingot into a thin disc-shape wafer 1 (see FIG. 1 [A](a)).

(2) A coarse chamfering step of chamfering a peripheral edge portion of the wafer 1 obtained through the slicing step. At a chamfered portion of the wafer 1 subjected to the coarse chamfering, mechanical damage 2 is generated (see FIG. 1 [A](b)).

(3) A lapping step of flattening a chamfered wafer, where both surfaces of the wafer are ground with pouring a lapping solution containing abrasive grains by a lapping apparatus. Mechanical damage 2 is generated on the lapped wafer 1 (see FIG. 1 [A](c)).

(4) The lapping powder adhered to the both surface of the lapped wafer 1 is removed by cleaning or etching. The mechanical damage 2 can be removed to some extent or almost completely by cleaning or etching. At the same time, etch pit 3 is generated on the wafer 1 by etching (see FIG. 1 [A](d)).

(5) One surface 1a of the cleaned or etched wafer 1 is subjected to surface-grinding to achieve high flatness of the surface. The mechanical damage 2 and the grinding striations 4 are generated on the surface 1a of the wafer 1 subjected to surface-grinding (see FIG. 1 [A](e)).

(6) A polishing step of polishing both surfaces 1a, 1b of the wafer 1 wherein one surface 1a is ground. The mechanical damage 2 and the etch pit 3 on the both surfaces 1a, 1b of the wafer 1 are removed by the polishing step, but grinding striations remain on the surface 1a which was surface-ground (see FIG. 1 [A](f)).

(7) The peripheral edge portion of the wafer 1 is mirror-polished before or after the double side polishing step. Thereby, the mechanical damage 2 and the etch pit 3 at the peripheral edge portion of the wafer 1 are removed. (see FIG. 1 [A](f)).

(8) The surface 1a of the wafer 1 which is surface-ground is defined as a back surface, and a front surface of the wafer 1 subjected to the double side polishing is subjected to a finishing mirror-polishing. Thereby, there can be obtained the semiconductor wafer having a front surface 1b and a back surface 1a which is surface-ground (see FIG. 1 [A](g)).

(9) A cleaning step of cleaning and drying the wafer after polishing (not shown).

Next, a lapping apparatus, a surface-grinding apparatus and a polishing apparatus used in the present invention and processing condition will be explained below.

Figure 2:
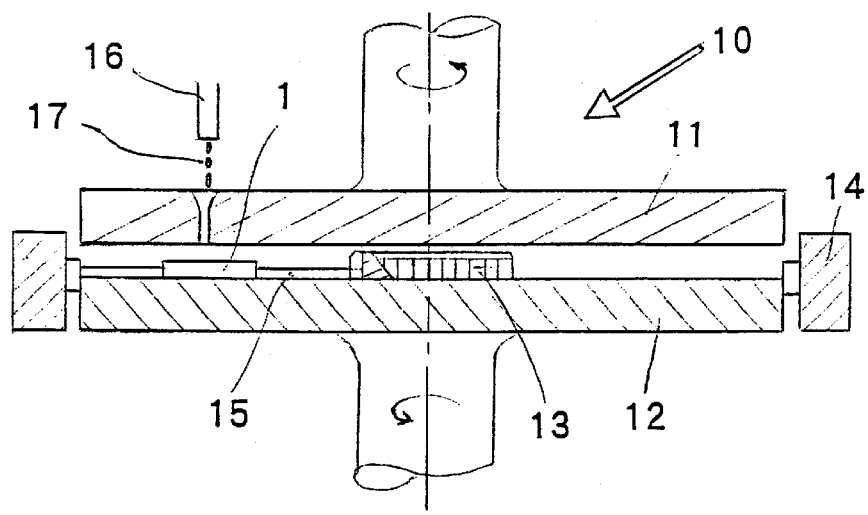
FIG. 2 is a schematic view showing a double side lapping apparatus used in the method of the present invention.

In a flattening step, a lapping apparatus is used at first. FIG. 2 shows an example of double side lapping apparatus used in the method of the present invention.

A sliced wafer 1 is set between the lapping turn tables (the upper turn table 11 and the lower turn table 12) which are faced each other vertically. Lapping solution 17, which is generally a mixture of alumina or silicon carbide abrasive grains and glycerol is poured from a lapping solution nozzle 16 to a space between the lapping table and the wafer, in order to mechanically grind both surface of the wafer by rotating the lapping table for rubbing with pressing it on the wafer under pressure.

The upper turn table 11 and the lower turn table 12 are rotated in opposite directions to each other. A center gear (sun gear) 13 is provided on the lower turn table 12, and an internal gear 14 is provided on the outer periphery of the lower turn table 12. Plural geared carriers 15 carrying plural wafers 1 each set in a wafer receiving hole, are interposed between the upper and lower lapping turn tables, and rotated and revolved between the center gear 13 and the internal gear 14. Thereby, the plural wafers 1 can be lapped at the same time under an adequate pressure applied by the upper turn table 11.

Figure 3:
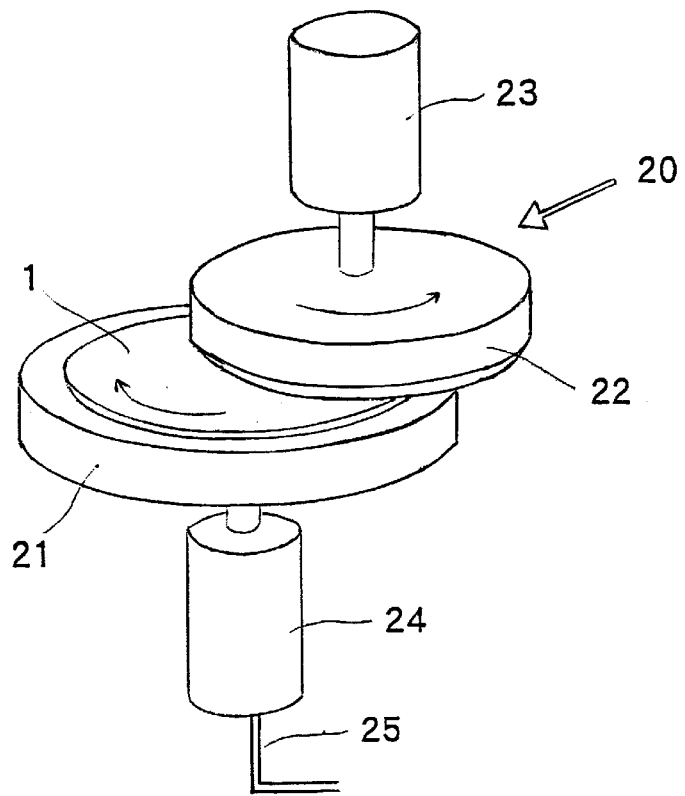
FIG. 3 is a schematic view showing a single side surface-grinding apparatus used in the method of the present invention.

Next, the surface-grinding apparatus will be explained. It is an apparatus for grinding the wafer with a grinding wheel (grinding stone) after lapping and etching treatment to achieve higher flatness. As such an apparatus, a double side grinding apparatus for grinding both surfaces of the wafer at the same time, an infeed surface-grinding apparatus for grinding one surface or the like, are well known. In the method of the present invention, the latter is used. One example of the apparatus is shown in FIG. 3.

In the infeed surface-grinding apparatus 20, the wafer 1 lapped as described above is fixed on a rotatable suction plate 21 having a suction type fixing mechanism, and rotated by a suction plate driving motor 24, and the front surface or the back surface of the wafer can be ground with a cup-like grinding wheel 22 driven at high speed by a grinding wheel driving motor 23. When the wafer 1 is fixed with vacuum, a vacuum source (not shown) to which a vacuum pipe 25 is connected, is used.

The double side polishing apparatus used in a double side polishing step is for mechanochemically polishing both surfaces of the wafer having stable thickness accuracy and flatness accuracy, subjected to the slicing step, the chamfering step, the flattening step and the etching step.

Figure 4:
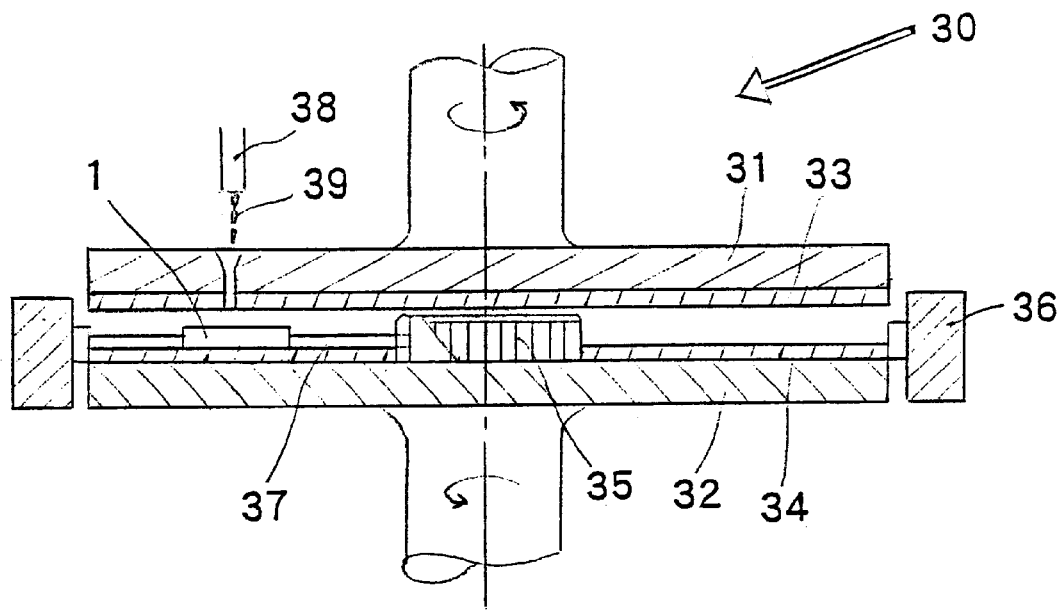
FIG. 4 is a schematic view showing a double side polishing apparatus used in the method of the present invention.

Various polishing methods can be applied to the double side polishing described above. For example, the double side polishing apparatus shown in FIG. 4 will be explained below.

A wafer 1 subjected to surface-grinding is set between polishing pads 33, 34 consisting of polyurethane foamed layer or the like adhered on the turn tables (the upper turn table 31 and the lower turn table 32) of the double side polishing apparatus 30 which are faced each other vertically. With pouring a polishing solution 39 generally consisting of polishing abrasive grains such as silica suspended in an alkali solution from a polishing solution nozzle 38 to a space between the polishing pad and the wafer, to mechanochemically polish both surfaces of the wafer by rotating them for rubbing under pressure.

The upper turn table 31 and the lower turn table 32 are rotated in opposite directions to each other. A center gear (sun gear) 35 is provided on the lower turn table 32, and an internal gear 36 is provided on the outer periphery of the lower turn table 32. A plurality of geared carriers 37 carrying plural wafers 1 each set in a wafer receiving hole, are interposed between the upper and lower turn tables, and are rotated and revolved between the center gear 35 and the internal gear 36. Thereby, both surfaces of the plural wafers 1 can be polished at the same time under an adequate pressure applied by the upper turn table 31.

Figure 5:
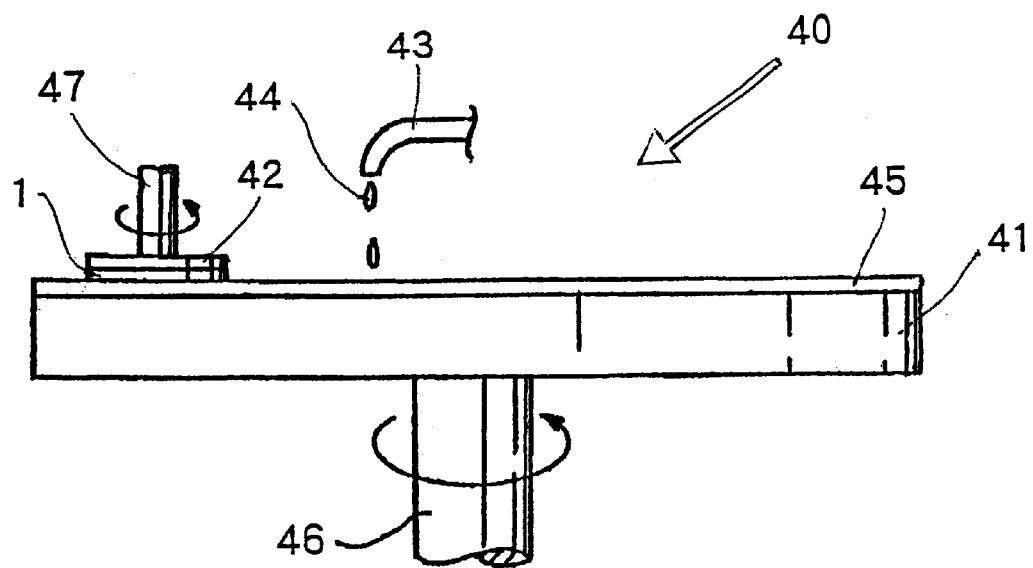
FIG. 5 is a schematic view showing a single side finishing mirror-polishing apparatus used in the method of the present invention.

The finishing mirror-polishing is conducted on one surface of the wafer in the method of the present invention. For example, it is conducted through use of a single side polishing apparatus 40 shown in FIG. 5 as follows. The back surface of the wafer 1 is fixed to a wafer holder 42 rotating with a holder shaft 47, using an adhesive such as wax which can be easily removed in the later cleaning step. With pouring a polishing agent 44 generally consisting of polishing abrasive grains such as silica suspended in an alkali solution from a nozzle 43 for a polishing agent to a space between the polishing cloth 45 and the wafer 1, a polishing cloth 45 consisting of polyurethane foamed layer or the like adhered on the turn table 41 is rotated with a turn table rotating shaft 46 at relative speed, with being loaded, to mirror-polish only front surface of the wafer mechanochemically.

In that case, other than the above-mentioned method wherein the back surface of the wafer is held by adhering it with wax, there is a method wherein the back surface of the wafer is held by a vacuum suction revolving carrier without using wax, or a method wherein the back surface of the wafer is held with a soft resin without using wax. Any other methods can be used in the present invention, and the method of the finishing mirror-polishing is not restricted to the above.

In the cleaning step, cleaning is conducted with, for example, SC-1 essentially comprising aqueous ammonia and hydrogen peroxide aqueous solution or SC-2 essentially comprising hydrochloric acid and hydrogen peroxide aqueous solution, in order to remove a polishing agent or the like adhered on the front surface of the wafer produced in the above-mentioned front surface finishing mirror-polishing step, and improve cleanness of the front and back surface.

In the wet etching step in the present invention, the mechanical damage layer formed on the front and back surface of the wafer formed in a flattening step according to a double side lapping method can be removed by chemical etching. An etching solution can be acid, alkali or the like. However, the flatness may be lowered depending on the kinds of the etching solution, a stirring condition of the etching solution during etching treatment, and progressing condition of the reaction. According to the present invention, the flatness does not need to be cared so much since the flatness can be improved by the later surface grinding step. However, it is preferable to conduct etching without spoiling the flatness obtained in the lapping step. The inventors made experiments, and revealed that the best etching solution is an alkali solution such as a 45 to 50% aqueous solution of sodium hydroxide or potassium hydroxide.

EXAMPLE

The following example is being submitted to further explain specific embodiment of the present invention. This example is not intended to limit the scope of the present invention.

EXAMPLE

Semiconductor wafers were fabricated from a semiconductor ingot according to the method shown in FIG. 1 [A] (a) to (g). 200 of them were determined as for their quality.

The apparatuses described above, namely, a double side lapping apparatus, a single side grinding apparatus, a double side polishing apparatus, a single side finishing mirror-polishing apparatus or the like were mainly used.

The wafers having a diameter of 300 mm and a thickness of 975 $\mu$m were obtained as a starting material by a slicing step, and subjected to lapping, grinding, polishing and the like.

The steps of lapping, grinding and polishing were conducted as follows with varying conditions therefor.

The double side lapping step was conducted varying a stock removal in the range from 80 to 200 μm as a value of those of both surfaces put together.

The etching step was conducted using an alkali solution or acid solution with a sufficient stock removal to remove a mechanical damage layer formed during lapping.

The single side grinding was conducted using a grinding wheel such as a resin bond of #2000 to #4000 with a stock removal of 10 to 20 μm.

The double side polishing was conducted with a stock removal of 10 to 20 μm as a value of those of both surfaces put together, provided that the stock removal was determined so that the mechanical damage layer formed during a single side grinding can be removed.

The double side polishing was conducted using a foamed urethane polishing cloth or a rigid urethane polishing pad (polishing cloth) as a polishing cloth. A polishing agent containing colloidal silica was used.

Even after the above-mentioned double side polishing, grinding striations remained. The grinding striation is different from the mechanical damage, but is a shape formed on the surface by a grinding wheel, namely like undulation, which remains even after the double side polishing.

The surface on which the grinding striations remained was determined as a back surface, the other surface, namely the front surface was subjected to a finishing mirror-polishing. The polishing was conducted with a stock removal of 1 to 2 μm by a copying polishing method wherein only the front surface of the wafer was mechanochemically polished to be a mirror surface.

After subjected to the cleaning step as a final step, the wafers were evaluated, and revealed excellent as follows.

(1) the flatness of the wafer was quite excellent as 0.20 μm as represented by $SBIR_{max}$.

The flatness was measured through use of an electric capacitive sensing thickness measuring apparatus (Galaxy-AFS manufactured by ADE corporation), and represented by $SBIR_{max}$ (Site Back—side Ideal Range: a standardized value according to SEMI standard Ml or the like, a cell size of 25×25).

(2) The front surface of the wafer was finished as a mirror surface having high brightness with no grinding striations nor micro roughness similar thereto.

(3) On the back surface, there remained grinding striations as micro roughness having a P-V value of about 30 to 50 mm and an interval of about 1 to 10 mm. However, they were very fine, and therefore, the grinding striations on the back surface were not transferred to the front surface of the wafer when the wafer was chucked during device process.

P-V value shows a kind of microroughness, and is measured through use of NANOMETRO 330F (a laser displacement measuring apparatus manufactured by Kuroda Seikousha) in an area of 20 mm×5 mm. The P-V value is a maximal difference between a peak and a valley.

The wafer of the present invention were determined in the device step as for the problems in a device process, such as indistinguishability of the front surface from the back surface, necessity of re-adjustment of sensing sensitivity, difficulty of chucking and releasing the wafer, and liabilities in a conveying line such as contamination, which were easily caused in the case of the wafer wherein both surfaces were mirror-polished and had high flatness because flatness on the back surface was too good. Such problems were not caused in the wafer of the present invention.

The present invention is not limited to the above-described embodiment. The above-described embodiment is a mere example, and those having the substantially same structure as that described in the appended claims and providing the similar action and effects are included in the scope of the present invention.

For example, the silicon wafer having a diameter of 300 mm (12 inches) was processed in the embodiment of the present invention. However, the present invention is applicable to the wafer having a large diameter such as 200 mm (8 inches) to 400 mm (16 inches) or more. Therefore, these modifications are included within the scope of the present invention.

Furthermore, the method of the embodiment of the present invention comprises the steps shown in FIG. 1 [A]. The present invention is not limited to the steps shown there. There can be further added a heat treatment step, a cleaning step or the like, some of the steps can be omitted, and the sequence of the steps can be changed.

What is claimed is:

1. A method for fabricating a semiconductor wafer comprising at least slicing a wafer from a semiconductor ingot, the wafer having opposite front and back surfaces, lapping both of the opposite front and back surfaces of the wafer, removing a mechanical damage layer by etching treatment, flattening only the back surface of the wafer and not the front surface by a surface-grinding means, polishing both of the front and back surfaces, and then subjecting the front surface of the wafer to a finishing mirror-polishing to provide a mirror surface when defining the surface subjected to surface-grinding as the back surface of the wafer.

2. The method for fabricating a semiconductor wafer according to claim 1 wherein a mirror edge polishing is conducted before or after the polishing of both of the front and back surfaces.

3. The method for fabricating a semiconductor wafer according to claim 2 wherein the etching treatment is conducted by a wet etching method using an alkali solution as an etching solution.

4. The method for fabricating a semiconductor wafer according to claim 1 wherein the etching treatment is conducted by a wet etching method using an alkali solution as an etching solution.

* * * * *